(12) United States Patent
Kotov et al.

(10) Patent No.: US 8,138,524 B2
(45) Date of Patent: Mar. 20, 2012

(54) SELF-ALIGNED METHOD OF FORMING A SEMICONDUCTOR MEMORY ARRAY OF FLOATING MEMORY CELLS WITH SOURCE SIDE ERASE, AND A MEMORY ARRAY MADE THEREBY

(75) Inventors: Alexander Kotov, Sunnyvale, CA (US); Amitay Levi, Cupertino, CA (US); Hung Q. Nguyen, Fremont, CA (US); Pavel Klinger, San Jose, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 803 days.

(21) Appl. No.: 11/592,104

(22) Filed: Nov. 1, 2006

(65) Prior Publication Data

US 2008/0099789 A1 May 1, 2008

(51) Int. Cl.
*H01L 29/788* (2006.01)
(52) U.S. Cl. ............... 257/202; 257/E21.409; 438/467; 365/185.01
(58) Field of Classification Search .............. 257/202, 257/315, E21.409, E21.602, E27.07, E29.3, 257/316, 317; 438/128, 257, 267; 365/185.01
See application file for complete search history.

(56) References Cited

U.S. PATENT DOCUMENTS

| | | |
|---|---|---|
| 4,757,360 A | 7/1988 | Faraone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |
| 5,293,337 A | 3/1994 | Aritome et al. |
| 5,429,965 A | 7/1995 | Shimoji |
| 5,493,138 A | 2/1996 | Koh |
| 5,544,103 A | 8/1996 | Lambertson |
| 5,572,054 A | 11/1996 | Wang et al. |

(Continued)

FOREIGN PATENT DOCUMENTS

CN 1464550 A 12/2003
(Continued)

OTHER PUBLICATIONS

English abstract of China Patent No. CN1464550 printed from esp#cnet database, 1 pg.

*Primary Examiner* — Thomas L Dickey
*Assistant Examiner* — Fazli Erdem
(74) *Attorney, Agent, or Firm* — DLA Piper LLP (US)

(57) ABSTRACT

A method of forming an array of floating gate memory cells, and an array formed thereby, wherein each memory cell includes a substrate of semiconductor material having a first conductivity type, source and drain regions formed in the substrate, a block of conductive material disposed over and electrically connected to the source, and a floating gate having a first portion disposed over and insulated from the source region and a second portion disposed over and insulated from the channel region. The floating gate first portion includes a sloped upper surface and a side surface that meet at an acute edge. An electrically conductive control gate is disposed over and insulated from the channel region for controlling a conductivity thereof.

34 Claims, 5 Drawing Sheets

U.S. PATENT DOCUMENTS

| | | |
|---|---|---|
| 5,751,048 A | 5/1998 | Lee et al. |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 5,939,749 A | 8/1999 | Taketa |
| 6,091,104 A | 7/2000 | Chen |
| 6,103,573 A | 8/2000 | Harari et al. |
| 6,140,182 A | 10/2000 | Chen |
| 6,157,575 A | 12/2000 | Choi |
| 6,211,547 B1 | 4/2001 | Kao |
| 6,222,227 B1 | 4/2001 | Chen |
| 6,252,799 B1 | 6/2001 | Liu et al. |
| 6,329,685 B1 | 12/2001 | Lee |
| 6,525,371 B2 | 2/2003 | Johnson et al. |
| 6,563,167 B2 | 5/2003 | Chern |
| 6,627,946 B2 * | 9/2003 | Wang ............ 257/316 |
| 6,660,364 B2 | 12/2003 | Yoshida et al. |
| 6,727,545 B2 | 4/2004 | Wang et al. |
| 6,855,980 B2 | 2/2005 | Wang et al. |
| 6,868,015 B2 * | 3/2005 | Wang .......... 365/185.29 |
| 6,943,075 B2 | 9/2005 | Joo |
| 7,018,897 B2 | 3/2006 | Wang |
| 2005/0269622 A1 * | 12/2005 | Klinger et al. ............ 257/315 |
| 2006/0113584 A1 | 6/2006 | Fukuda et al. |

FOREIGN PATENT DOCUMENTS

| | | |
|---|---|---|
| EP | 0 389 721 A2 | 10/1990 |
| JP | 2001085544 | 3/2001 |
| JP | 2001127179 | 5/2001 |
| JP | 2002158303 | 5/2002 |
| JP | 2006-135178 | 5/2006 |
| WO | WO 9218980 | 10/1992 |

* cited by examiner

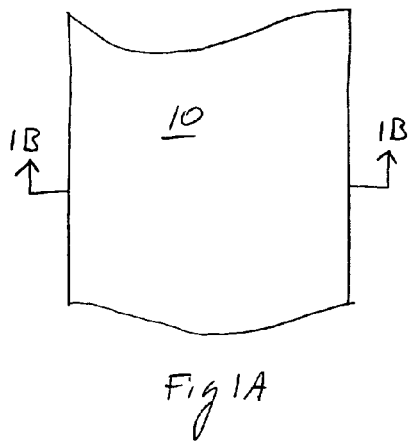
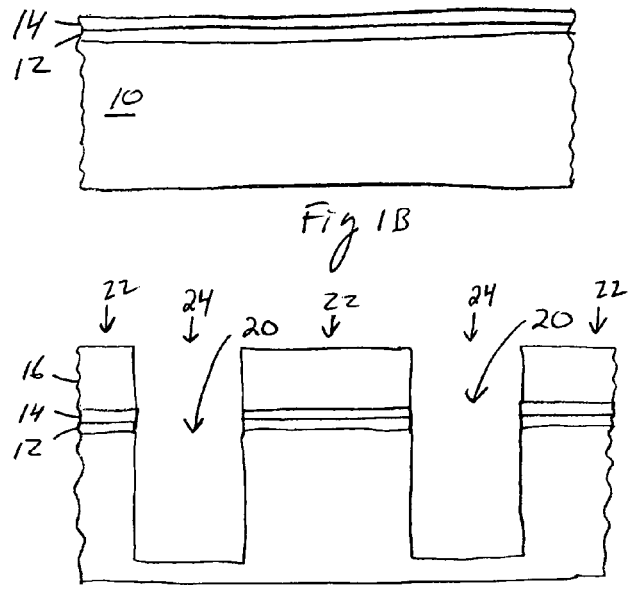
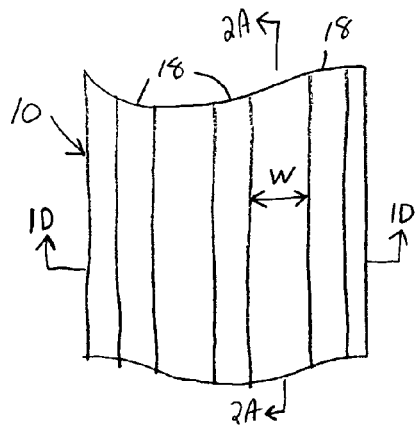
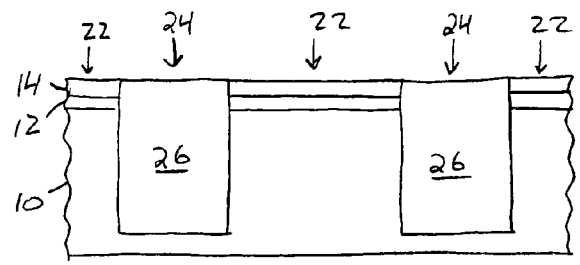
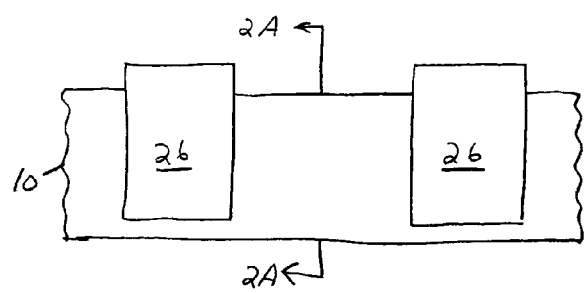

SELF-ALIGNED METHOD OF FORMING A
SEMICONDUCTOR MEMORY ARRAY OF
FLOATING MEMORY CELLS WITH SOURCE
SIDE ERASE, AND A MEMORY ARRAY
MADE THEREBY

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the split gate type.

There is a constant need to shrink the size of the memory cell arrays in order to maximize the number of memory cells on a single wafer. It is well known that forming split gate type memory cells in pairs, with each pair sharing a single source region, and with adjacent pairs of cells sharing a common drain region, reduces the size of the memory cell array. Traditionally, floating gates have been formed with a sharp edge facing the control gate to enhance Fowler-Nordheim tunneling, which is used to move electrons off of the floating gate and onto the control gate during a control gate erase operation. However, there is a need to improve the efficiency of erasure.

There is a need for a non-volatile, split gate type floating gate memory cell array with significant cell size reduction while providing enhanced erasure efficiency.

SUMMARY OF THE INVENTION

The above-mentioned problems are solved by providing a source-side erase memory cell design and method of making the same with sharpened edges facing source line conductive blocks of material.

An electrically programmable and erasable memory device includes a substrate of semiconductor material having a first conductivity type, first and second spaced-apart regions formed in the substrate and having a second conductivity type, with a channel region formed in the substrate therebetween, wherein the channel region includes a first portion adjacent the first region and a second portion adjacent the second region, a block of conductive material disposed over and electrically connected to the first region, an electrically conductive floating gate having a first portion disposed over and insulated from the first region and a second portion disposed over and insulated from the channel region first portion for controlling a conductivity thereof, wherein the floating gate first portion includes a sloped upper surface and a side surface that meet at an acute edge, and an electrically conductive control gate disposed over and insulated from the channel region second portion for controlling a conductivity thereof.

An array of electrically programmable and erasable memory devices includes a substrate of semiconductor material having a first conductivity type, spaced apart isolation regions formed on the substrate which are substantially parallel to one another and extend in a first direction, with an active region between each pair of adjacent isolation regions, and each of the active regions including a plurality of pairs of memory cells. Each of the memory cell pairs includes a first region formed in the substrate, a pair of second regions formed in the substrate with a pair of channel regions each formed in the substrate between the first region and one of the second regions wherein the first and second regions have a second conductivity type and wherein each of the channel regions includes a first portion adjacent the first region and a second portion adjacent one of the second regions, a block of conductive material disposed over and electrically connected to the first region, a pair of electrically conductive floating gates each having a first portion disposed over and insulated from the first region and a second portion disposed over and insulated from one of the channel region first portions for controlling a conductivity thereof wherein each of the floating gate first portions includes a sloped upper surface and a side surface that meet at an acute edge, and a pair of electrically conductive control gates each disposed over and insulated from one of the channel region second portions for controlling a conductivity thereof.

A method of forming a semiconductor memory cell includes forming first and second spaced-apart regions of a second conductivity type in a substrate of a first conductivity type with a channel region in the substrate therebetween wherein the channel region includes a first portion adjacent the first region and a second portion adjacent the second region, forming a block of conductive material disposed over and electrically connected to the first region, forming an electrically conductive floating gate having a first portion disposed over and insulated from the first region and a second portion disposed over and insulated from the channel region first portion for controlling a conductivity thereof wherein the floating gate first portion includes a sloped upper surface and a side surface that meet at an acute edge, and forming an electrically conductive control gate disposed over and insulated from the channel region second portion for controlling a conductivity thereof.

A method of forming an array of electrically programmable and erasable memory devices includes forming spaced apart isolation regions on the substrate which are substantially parallel to one another and extend in a first direction with an active region between each pair of adjacent isolation regions, wherein the substrate has a first conductivity type, and forming pairs of memory cells in each of the active regions. The formation of each of the memory cell pairs includes forming a first region in the substrate, forming a pair of second regions in the substrate, with a pair of channel regions each formed in the substrate between the first region and one of the second regions, wherein the first and second regions have a second conductivity type, and wherein each of the channel regions includes a first portion adjacent the first region and a second portion adjacent one of the second regions, forming a block of conductive material disposed over and electrically connected to the first region, forming a pair of electrically conductive floating gates each having a first portion disposed over and insulated from the first region and a second portion disposed over and insulated from one of the channel region first portions for controlling a conductivity thereof wherein each of the floating gate first portions includes a sloped upper surface and a side surface that meet at an acute edge, and forming a pair of electrically conductive control gates each disposed over and insulated from one of the channel region second portions for controlling a conductivity thereof.

A method of operating a semiconductor memory cell that includes a substrate of semiconductor material of a first conductivity type, first and second spaced-apart regions formed in the substrate and having a second conductivity type, with a channel region formed in the substrate therebetween, wherein the channel region includes a first portion adjacent the first region and a second portion adjacent the second region, a block of conductive material disposed over and electrically connected to the first region, an electrically conductive floating gate having a first portion disposed over and insulated from the first region and a second portion disposed over and insulated from the channel region first portion for controlling a conductivity thereof, wherein the floating gate first portion includes a sloped upper surface and a side surface that meet at an acute edge, and an electrically conductive control gate disposed over and insulated from the channel region second portion for controlling a conductivity thereof. The method include programming the memory cell with electrons by placing positive voltages on the first and second regions and on the control gate sufficient to induce electrons from the second region to flow into the channel region and inject themselves onto the floating gate, and erasing the memory cell by placing a positive voltage on the first region sufficient to induce electrons on the floating gate to tunnel from the acute edge to the block of conductive material.

Other objects and features of the present invention will become apparent by a review of the specification, claims and appended figures.

BRIEF DESCRIPTION OF THE DRAWINGS

FIG. 1A is a top view of a semiconductor substrate used in the first step of the method of present invention to form isolation regions.

FIG. 1B is a cross sectional view of the structure taken along the line 1B-1B showing the initial processing steps of the present invention.

FIG. 1C is a top view of the structure showing the next step in the processing of the structure of FIG. 1B, in which isolation regions are defined.

FIG. 1D is a cross sectional view of the structure in FIG. 1C taken along the line 1D-1D showing the isolation trenches formed in the structure.

FIG. 1E is a cross sectional view of the structure in FIG. 1D showing the formation of isolation blocks of material in the isolation trenches.

FIG. 1F is a cross sectional view of the structure in FIG. 1E showing the final structure of the isolation regions.

DETAILED DESCRIPTION OF THE PREFERRED EMBODIMENTS

Figure 2A:
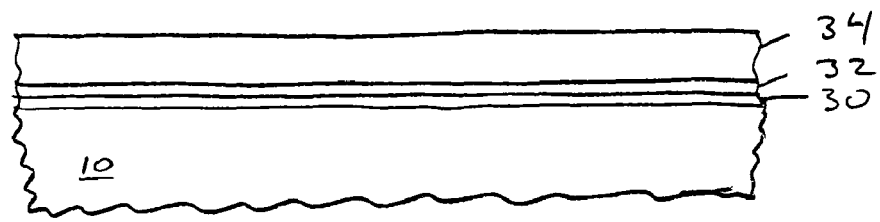
FIGS. 2A-2K are cross sectional views of the semiconductor structure in FIG. 1F taken along the line 2A-2A showing in sequence the steps in the processing of the semiconductor structure in the formation of a non-volatile memory array of floating gate memory cells.

The method of forming the non-volatile memory device is illustrated in FIGS. 1A to 1F and 2A to 2K. The method begins with a semiconductor substrate 10, which is preferably of P type and is well known in the art. The thicknesses of the layers described below will depend upon the design rules and the process technology generation. What is described herein is for the 0.13 micron process. However, it will be understood by those skilled in the art that the present invention is not limited to any specific process technology generation, nor to any specific value in any of the process parameters described hereinafter.

Isolation Region Formation

FIGS. 1A to 1F illustrate the well known STI method of forming isolation regions on a substrate. Referring to FIG. 1A there is shown a top plan view of a semiconductor substrate 10 (or a semiconductor well thereof), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 50-150 Å. Nitrogen doped oxide or other insulation dielectrics can also be used. Second layer 14 can be silicon nitride (hereinafter "nitride"), which is formed over oxide layer 12 preferably by CVD or PECVD to a thickness of approximately 1000-5000 Å. FIG. 1B illustrates a cross-section of the resulting structure.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide/dielectric etch processes) to form trenches 20 in the structure. The distance W between adjacent stripes 18 can be as small as the smallest lithographic feature of the process used. A silicon etch process is then used to extend trenches 20 down into the silicon substrate 10 (e.g. to a depth of approximately 500 Å to several microns), as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed (e.g. grown) on exposed portions of the substrate surface in stripe regions 18. FIGS. 1A to 1F illustrate the memory cell array region of the substrate, in which columns of memory cells will be formed in the active regions 22 which are separated by the isolation regions 24.

Memory Cell Formation

The structure shown in FIG. 1F is further processed as follows to form non-volatile memory cells. FIGS. 2A to 2K show the cross sections of the structure in the active regions 22 from a view orthogonal to that of FIG. 1F (along line 2A-2A as shown in FIGS. 1C and 1F), as the next processing steps are performed. An insulation layer 30 (preferably oxide or nitrogen doped oxide) is first formed over the substrate 10 (e.g. by thermal oxidation growth), followed by the formation of a layer of polysilicon 32 (hereinafter "poly") over the oxide layer 30 (e.g. by poly deposition), followed by the formation of a thick insulation layer 34 (e.g. nitride) over the poly layer 32 (e.g. by nitride deposition), as shown in FIG. 2A. It should be noted that this same structure can be formed during the isolation region formation described above, by skipping the layer etch processes of FIG. 1F, and using a poly material for layer 14 instead of nitride, leaving the structure of FIG. 1E that would correspond to the structure of FIG. 2A (but without nitride layer 34).

Figure 2B:
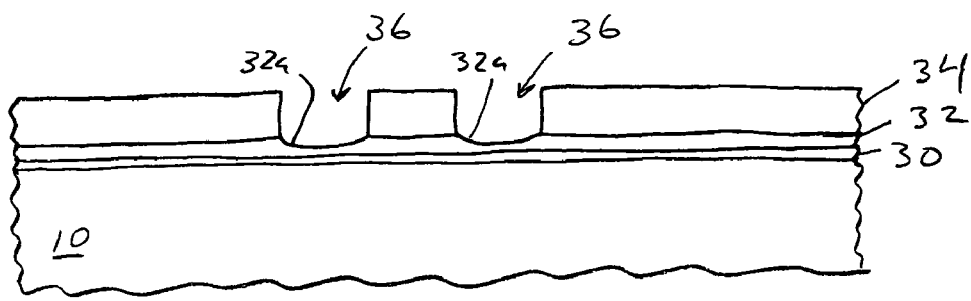

A lithographic etch process is next performed, where suitable photo resist material is applied on the nitride layer 34, and a masking step is performed to selectively remove the photo resist material and selectively expose certain portions of nitride layer 34. An anisotropic nitride etch is then performed to remove the exposed portions of the nitride layer 34, thus creating trenches 36 that extend down to and selectively expose poly layer 32. A controlled poly etch follows, which creates a sloped upper surface 32a for the exposed portions of poly layer 32 in trenches 36. The resulting structure (after removal of the photo resist material) is illustrated in FIG. 2B.

Figure 2C:
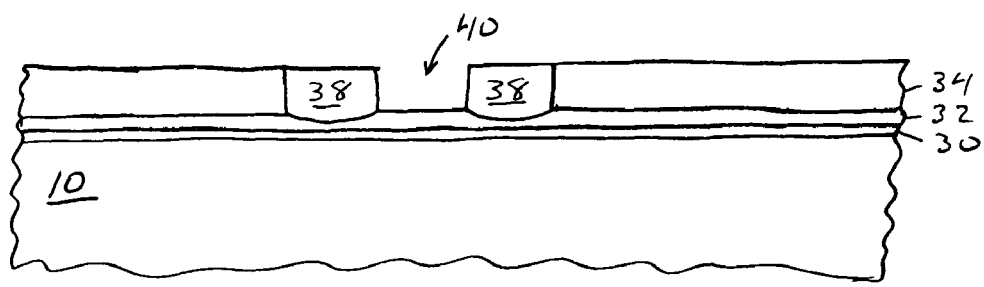

Trenches 36 are next filled with an insulation material (e.g. oxide), by depositing a thick oxide layer (e.g. via TEOS) that fill trenches 36 with oxide, followed by a Chemical-Mechanical-Polishing (CMP) etch (using nitride layer 34 as an etch stop) to remove the oxide layer except for oxide blocks 38 in trenches 36 (disposed over sloped surfaces 32a). A lithographic etch process is next performed (photo-resist formation, masking to selectively remove photoresist, nitride etch) to selectively expose and remove portions of nitride layer 34 between pairs of the oxide blocks 38, leaving trenches 40 between pairs of oxide blocks 38, as shown in FIG. 2C.

Figure 2D:
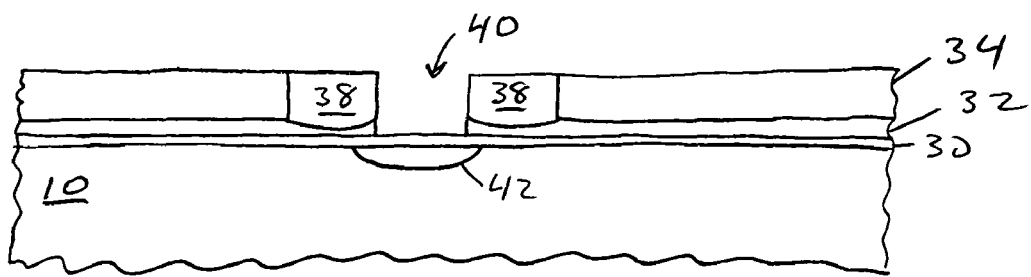

An anisotropic poly etch is next performed to remove exposed portions of poly layer 32 at the bottoms of trenches 40, to selectively expose portions of oxide layer 30. Suitable ion implantation (and possible anneal) that, depending upon if the substrate is P or N type, may include arsenic, phosphorous, boron and/or antimony (and possible anneal) is then made across the surface of the structure to form first (source) regions 42 in the exposed substrate portions at the bottom of trenches 40. The source regions 42 are self-aligned to the trenches 40, and have a second conductivity type (e.g. N type) that is different from a first conductivity type of the substrate (e.g. P type). The ions have no significant effect on the nitride layer 34 or oxide blocks 38. The resulting structure is shown in FIG. 2D.

Figure 2E:
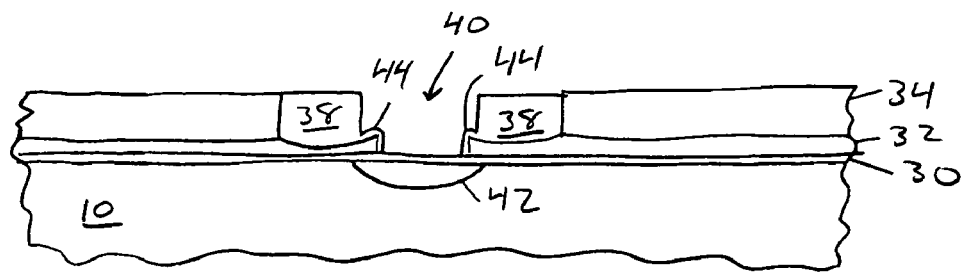
Figure 2F:
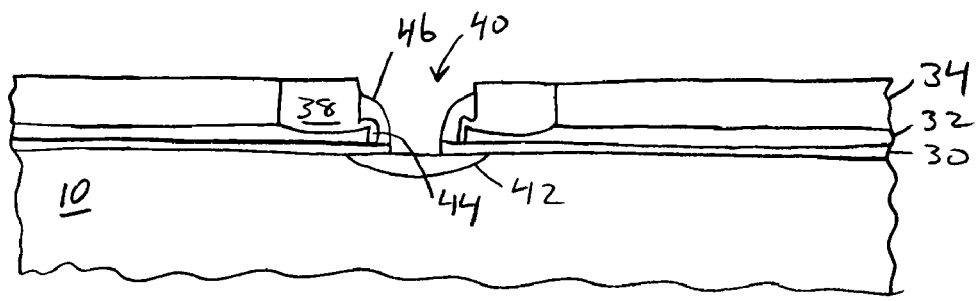

A wet oxide etch is next performed to etch back exposed portions of the sidewalls of oxide blocks 38, thus exposing small portions of the sloped surfaces 32a of poly layer 32. A thermal oxidation process and/or HTO oxide deposition are then used to form an oxide layer 44 that extends up the exposed sidewalls and over the exposed top surface portions of poly layer 32 in trenches 40, as shown in FIG. 2E. Then, poly spacers 46 are then formed along the sidewalls of trenches 40. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Spacers 46 are formed by depositing polysilicon over the structure followed by an anisotropic poly etch. Poly spacer formation is followed by an oxide etch that removes the exposed portions of oxide layer 30 between spacers 46, thus exposing the substrate 10, as illustrated in FIG. 2F.

Figure 2G:
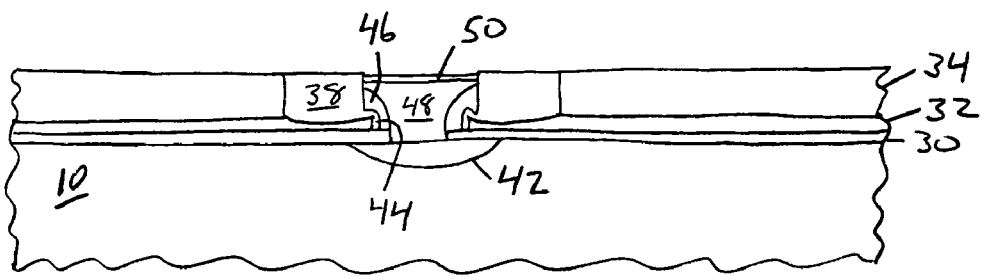
Figure 2H:
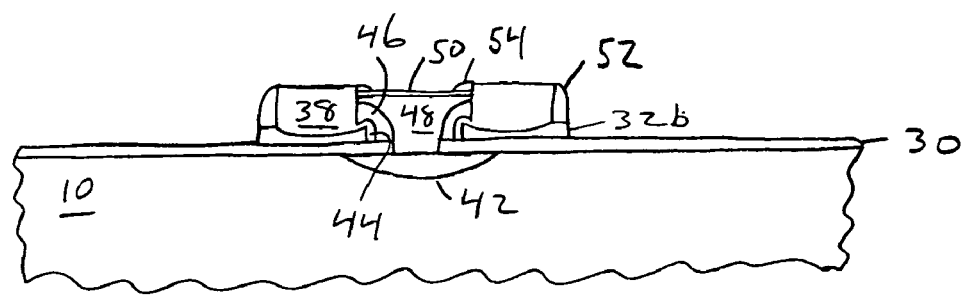

A thick poly layer is deposited over the structure, followed by a poly Chemical-Mechanical-Polishing (CMP) etch (using nitride layer 34 as an etch stop) to remove the poly layer except for poly blocks 48 in trenches 40. A poly etch back process is performed to remove a top portion of poly blocks 48 (so that the upper surface of these blocks are below the upper surface of oxide blocks 38). An oxidation step is next performed to form an oxide layer 50 on the upper surfaces of poly blocks 48, as shown in FIG. 2G. A nitride etch is next used to remove nitride layer 34. Nitride spacers 52 and 54 are formed next along sidewalls of oxide blocks 38 via nitride deposition and anisotropic etch back. As will become apparent below, the width of nitride spacers 52 will dictate the coupling ratio between the floating gate and word line (i.e. dictates the eventual overlap of the floating and control gates). An anisotropic poly etch is next performed to remove exposed portions of poly layer 32, resulting in separate poly blocks 32b as illustrated in FIG. 2H.

Figure 2I:
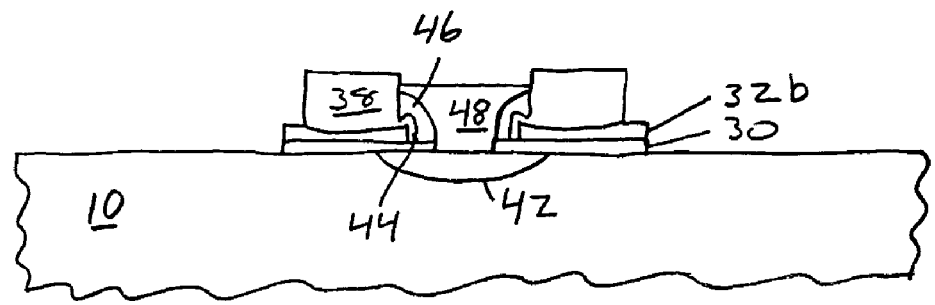
Figure 2J:
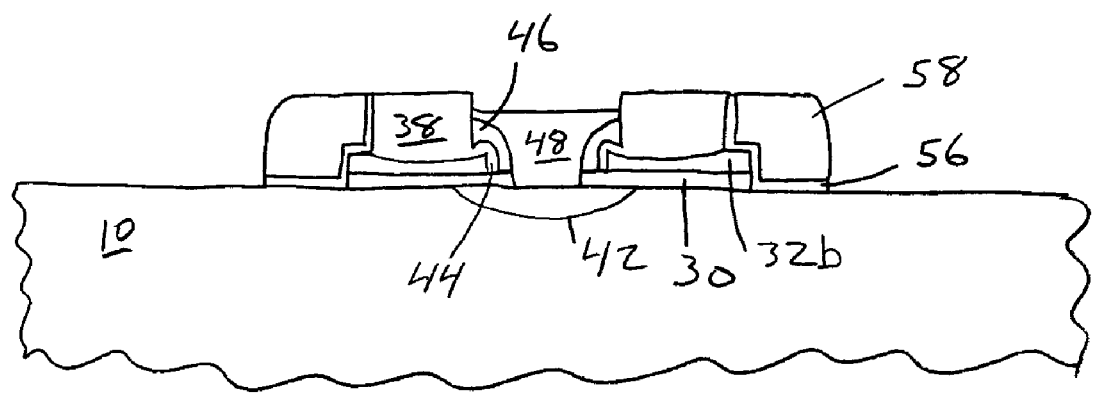

A nitride etch is performed next, which removes the nitride spacers 52/54. An oxide etch is then used to remove oxide layer 50, and exposed portions of oxide layer 30 (exposing the substrate 10), as illustrated in FIG. 2I. An insulation layer 56 is next formed over the structure. Insulation layer 56 can be a single layer of insulation layer (e.g. oxide), or a multi-material layer made from successfully deposited sub-layers of insulation materials (e.g. oxide-nitride-oxide, otherwise known as ONO insulation). Poly spacers 58 are next formed over insulation layer 56 (generally over and insulated from substrate 10, and generally laterally adjacent to poly layer 32 and oxide blocks 38). An oxide etch follows, which removes exposed portions of oxide layer 56, leaving the structure shown in FIG. 2J.

Nitride spacers 60 are formed laterally adjacent to poly spacers by a nitride deposition and etch process. A suitable ion implantation (and possible anneal) is used to form second (drain) regions 62 in the substrate adjacent spacers 60. Insulation material 64, such as BPSG or oxide, is then formed over the entire structure. A masking step is performed to define etching areas over the drain regions 62. The insulation material 64 is selectively etched in the masked regions to create contact openings that extend down to drain regions 62. The contact openings are then filled with a conductor metal (e.g. tungsten) to form metal contacts 66 that are electrically connected to drain regions 62. The resulting memory cell structure is illustrated in FIG. 2K.

Figure 2K:
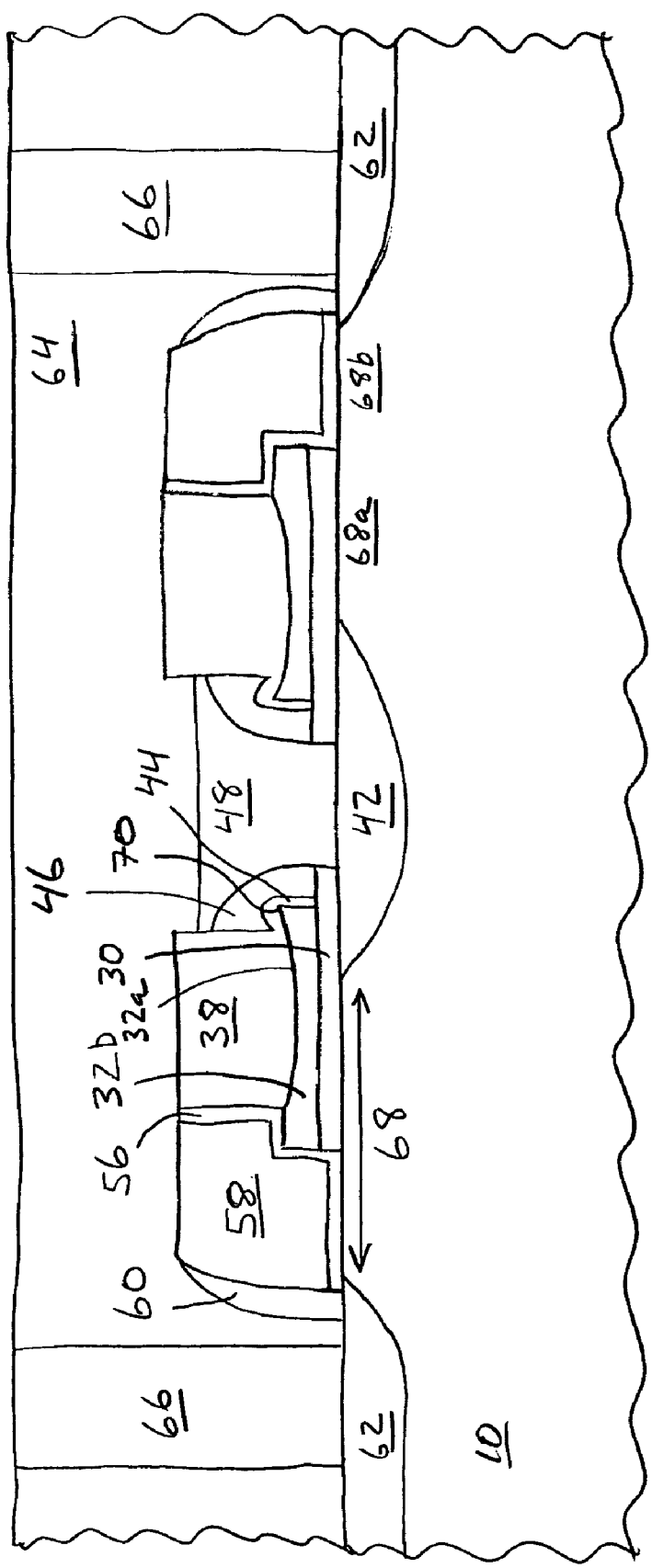

As shown in FIG. 2K, the above described process forms pairs of memory cells that mirror each other, with a memory cell formed on each side of the poly block 48. For each memory cell, first and second regions 42/62 form the source and drain regions respectively (although those skilled in the art know that source and drain can be switched during operation). For each memory cell, poly block 32b constitutes the floating gate, poly spacer 58 constitutes the control gate, and poly spacer 46 and poly block 48 together constitute the source block. Channel regions 68 for each memory cell are defined in the surface portion of the substrate that is in-between the source and drain 42/62. Each pair of memory cells share a common source region 42 and source block 46/48. Similarly, each drain region 62 can be shared between adjacent memory cells from different mirror sets of memory cells (not shown). The above-described process does not produce source regions 42 that extend across the isolation regions 24 (which can easily be done by a deep implant, or by removing the STI insulation material from the isolation region portions of trenches 40 before ion implantation). However, source blocks 46/48 (which are in electrical contact with source regions 42) are formed continuously across the isolation regions to adjacent active regions, and form source lines each of which electrically connects together all the source regions 42 for each row of paired memory cells.

The floating gates 32b each include a sloped upper surface 32a that terminates at an acute edge 70 with the side surface of the floating gate 32b. An acute edge is one that is formed by the intersection of two surfaces at an angle of less than 90 degrees. Acute edge 70 faces and is insulated from one of the control gates 58, thus providing a path for Fowler-Nordheim tunneling through oxide layer 44. Each floating gate 32b includes a first portion that extends over and is insulated from the source region 42, and a second portion that extends over and is insulated from a first portion 68a of the channel region 68. Each control gate 58 has a lower portion that is laterally adjacent to (and insulated from) floating gate 32b and extends over and is insulated from a second portion 68b of the channel region 68, and an upper portion that extends up and over (and is insulated from) a portion of floating gate 32b. In the embodiment illustrated in the figures, the floating gate upper surface includes a generally planar portion (i.e. not sloped) that is disposed under the control gate. Each source block 46/48 has a lower portion that is laterally adjacent to floating gate 32b and extends over and is preferably is in electrical contact with one of the source regions 42, and an upper portion that extends up and over (and is insulated from) a portion of the floating gate 32b, including acute edge 70.

Memory Cell Operation

The operation of the memory cells will now be described. The operation and theory of operation of such memory cells are also described in U.S. Pat. No. 5,572,054, whose disclosure is incorporated herein by reference with regard to the operation and theory of operation of a non-volatile memory cell having a floating gate and a control gate, tunneling, and an array of memory cells formed thereby.

To initially erase a selected memory cell in any given active region 22, a ground potential is applied to its drain 70. A negative voltage (e.g. −4.2 to −7.0 volts) is applied to its control gate 58. And, a high-positive voltage (e.g. +7 volts) is applied to its source region 42 (and thus to its source block 46/48). Electrons on the floating gate 32b are induced through the Fowler-Nordheim tunneling mechanism to tunnel from the upper end of the floating gate 32b (primarily from acute edge 70), through the oxide layer 44, and onto source block 46/48, leaving the floating gate 32b positively charged. Tunneling is enhanced by the sharpness of acute edge 70, and by the negative voltage placed on the control gate 58 which helps drive the electrons toward acute edge 70. It should be noted that since each of the control gates 58 and source blocks 46/48 extend across the active and isolation regions as continuous control (word) and source lines, one memory cell in each active region is 'erased' at the same time.

When a selected memory cell is desired to be programmed, a small voltage (e.g. ~0.4 volt) is applied to its drain region 62. A positive voltage in the vicinity of the threshold voltage of the MOS structure (on the order of approximately +1.1 volts) is applied to its control gate 58. A positive high voltage (e.g. on the order of 6 volts) is applied to its source region 42 (and thus source block 46/48). Electrons generated by the drain region 62 will flow from the drain region 62 towards the source region 42 through the deeply depleted channel region 68. As the electrons travel across the channel region 68, they will see the high potential of floating gate 32b (because the floating gate 32b is strongly voltage-coupled to the positively charged source region 42 and source block 46/48). The electrons will accelerate and become heated, with most of them being injected into and through the insulating layer 30 and onto the floating gate 32b. Low or ground potential is applied to the source/drain regions 42/62 and control gates 58 for memory cell rows/columns not containing the selected memory cell. Thus, only the memory cell in the selected row and column is programmed.

The injection of electrons onto the floating gate 32b will continue until the reduction of the charge on the floating gate 32b can no longer sustain a high surface potential along the channel region 68 to generate hot electrons. At that point, the electrons or the negative charges in the floating gate 32b will decrease the electron flow from the drain region 62 onto the floating gate 32b.

Finally, to read a selected memory cell, ground potential is applied to its source region 42 (and source block 46/48). A read voltage (e.g. ~0.8 volt) is applied to its drain region 62 and approximately 1.8 to 2.5 volts (examples for typical power supply voltages that could be used with this type of device) is applied to its control gate 58. If the floating gate 32b is positively charged (i.e. the floating gate is discharged of electrons), then the channel region portion 68a directly below to the floating gate 32b is turned on. When the control gate 58 is raised to the read potential, the channel region portion 68b directly under the control gate 58 is also turned on. Thus, the entire channel region 68 will be turned on, causing electrons to flow from the source region 42 to the drain region 62. This sensed electrical current would be the "1" state.

On the other hand, if the floating gate 32b is negatively charged, the channel region portion 68a directly under the floating gate 32b is either weakly turned on or is entirely shut off. Even when the control gate 58 and the drain region 62 are raised to the read potentials, little or no current will flow through the channel region 68. In this case, either the current is very small compared to that of the "1" state or there is no current at all. In this manner, the memory cell is sensed to be programmed at the "0" state. Ground potential is applied to the source/drain regions 42/62 and control gates 58 for non-selected columns and rows so only the selected memory cell is read.

The memory cell array includes peripheral circuitry including conventional row address decoding circuitry, column address decoding circuitry, sense amplifier circuitry, output buffer circuitry and input buffer circuitry, which are well known in the art.

The above described method and resulting structure provides a memory cell array with reduced size and superior program efficiency. Providing a source block in electrical connection to the source region allows for source-side erasure. Acute edge 70 in particular enhances the tunneling efficiency between floating gate 32b and source block 46/48 during erasure. There is also an enhanced voltage coupling between each floating gate 32b and the corresponding source region 42 via source block 46/48 (electrically connected with the source region 42). Erasure is also enhanced by the voltage coupling between the floating gate 32b and the control gate 58.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

It is to be understood that the present invention is not limited to the embodiment(s) described above and illustrated herein, but encompasses any and all variations falling within the scope of the appended claims. For example, although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material who's etch property differs from that of silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate, which are regions that are doped to have a different conductivity type compared to other portions of the substrate. Single layers of insulating or conductive material could be formed as multiple layers of such materials, and vice versa. Lastly, while a pair of spacers 46 are shown in the figures on opposing sides of a trench, one skilled in the art will appreciate that such spacers can be continuously formed and connected together when formed in holes or trenches.

What is claimed is:

1. An electrically programmable and erasable memory device comprising:
   a substrate of semiconductor material having a first conductivity type;
   first and second regions formed in the substrate and having a second conductivity type, wherein the first and second regions are spaced apart from each other with a channel region formed in the substrate therebetween, and wherein the channel region includes a first portion adjacent the first region and a second portion adjacent the second region;
   an electrically conductive floating gate having a first portion disposed over and insulated from the first region and a second portion disposed over and insulated from the channel region first portion for controlling a conductivity thereof, wherein the floating gate first portion includes a sloped upper surface and a side surface that meet at an acute edge;
   a block of conductive material disposed over and in electrical contact with the first region, wherein the block of conductive material comprises a first portion that is laterally adjacent to and insulated from the floating gate first portion, and a second portion that extends up and over and is insulated from the floating gate first portion; and
   an electrically conductive control gate disposed over and insulated from the channel region second portion for controlling a conductivity thereof.

2. The device of claim 1, wherein the control gate comprises a first portion that is laterally adjacent to and insulated from the floating gate second portion, and a second portion that extends up and over and is insulated from the floating gate second portion.

3. The device of claim 1, wherein the floating gate second portion includes a generally planar horizontally extending upper surface portion disposed under the control gate.

4. The device of claim 1, wherein the acute edge directly faces and is insulated from the block of conductive material.

5. The device of claim 1, wherein the block of conductive material comprises:
   a first portion that is a spacer of conductive material having a first portion that is laterally adjacent to and insulated from the floating gate first portion and a second portion that extends up and over and is insulated from the floating gate first portion; and
   a second portion of conductive material that is disposed over and in electrical contact with the first region, and is disposed adjacent to and in electrical contact with the spacer.

6. The device of claim 5, wherein the acute edge directly faces and is insulated from the spacer of conductive material.

7. The device of claim 1, wherein the block of conductive material is insulated from the floating gate by insulation material having a thickness that permits Fowler-Nordheim tunneling.

8. An array of electrically programmable and erasable memory devices comprising:
   a substrate of semiconductor material having a first conductivity type;
   spaced apart isolation regions formed on the substrate which are substantially parallel to one another and extend in a first direction, with an active region between each pair of adjacent isolation regions; and
   each of the active regions including a plurality of pairs of memory cells, wherein each of the memory cell pairs comprises:
   a first region formed in the substrate,
   a pair of second regions formed in the substrate, with a pair of channel regions each formed in the substrate between the first region and one of the second regions, wherein the first and second regions have a second conductivity type, and wherein each of the channel regions includes a first portion adjacent the first region and a second portion adjacent one of the second regions,
   a pair of electrically conductive floating gates each having a first portion disposed over and insulated from the first region and a second portion disposed over and insulated from one of the channel region first portions for controlling a conductivity thereof, wherein each of the floating gate first portions includes a sloped upper surface and a side surface that meet at an acute edge,
   a block of conductive material disposed over and in electrical contact with the first region, wherein the block of conductive material comprises a first portion that is laterally adjacent to and insulated from the floating gate first portions, and a second portion that extends up and over and is insulated from the floating gate first portions, and a pair of electrically conductive control gates each disposed over and insulated from one of the channel region second portions for controlling a conductivity thereof.

9. The array of claim 8, wherein each of the control gates comprises a first portion that is laterally adjacent to and insulated from one of the floating gate second portions, and a second portion that extends up and over and is insulated from one of the floating gate second portions.

10. The array of claim 8, wherein each of the floating gate second portions includes a generally planar horizontally extending upper surface portion disposed under one of the control gates.

11. The array of claim 8, wherein each of the acute edges directly faces and is insulated from the block of conductive material.

12. The array of claim 8, wherein each of the blocks of conductive material comprises:
- a first portion that is a pair of spacers of conductive material each having a first portion that is laterally adjacent to and insulated from one of the floating gate first portions and a second portion that extends up and over and is insulated from one of the floating gate first portions; and
- a second portion of conductive material that is disposed over and in electrical contact with the first region, and is disposed adjacent to and in electrical contact with the spacers.

13. The array of claim 12, wherein each of the acute edges directly faces and is insulated from one of the spacers of the conductive material.

14. The array of claim 8, wherein the block of conductive material is insulated from each of the floating gates by insulation material having a thickness that permits Fowler-Nordheim tunneling.

15. The array of claim 8, further comprising:
- a plurality of conductive control lines of conductive material each extending across the active and isolation regions in a second direction perpendicular to the first direction and each electrically connecting together one of the control gates from each of the active regions.

16. The array of claim 8, further comprising:
- a plurality of conductive source lines of conductive material each extending across the active and isolation regions in a second direction perpendicular to the first direction and each electrically connecting together one of the conductive blocks from each of the active regions.

17. A method of forming a semiconductor memory cell, comprising:
- forming first and second regions of a second conductivity type in a substrate of a first conductivity type, wherein the first and second regions are spaced apart from each other with a channel region in the substrate therebetween, and wherein the channel region includes a first portion adjacent the first region and a second portion adjacent the second region;
- forming an electrically conductive floating gate having a first portion disposed over and insulated from the first region and a second portion disposed over and insulated from the channel region first portion for controlling a conductivity thereof, wherein the floating gate first portion includes a sloped upper surface and a side surface that meet at an acute edge;
- forming a block of conductive material disposed over and in electrical contact with the first region, wherein the block of conductive material comprises a first portion that is laterally adjacent to and insulated from the floating gate first portion, and a second portion that extends up and over and is insulated from the floating gate first portion; and
- forming an electrically conductive control gate disposed over and insulated from the channel region second portion for controlling a conductivity thereof.

18. The method of claim 17, wherein the control gate comprises a first portion that is laterally adjacent to and insulated from the floating gate second portion, and a second portion that extends up and over and is insulated from the floating gate second portion.

19. The method of claim 17, wherein the floating gate second portion includes a generally planar horizontally extending upper surface portion disposed under the control gate.

20. The method of claim 17, wherein the acute edge directly faces and is insulated from the block of conductive material.

21. The method of claim 17, wherein the formation of the block of conductive material comprises:
- forming a spacer of conductive material having a first portion that is laterally adjacent to and insulated from the floating gate first portion and a second portion that extends up and over and is insulated from the floating gate first portion; and
- forming conductive material that is disposed over and in electrical contact with the first region, and is disposed adjacent to and in electrical contact with the spacer.

22. The method of claim 21, wherein the acute edge directly faces and is insulated from the spacer of the conductive material.

23. The method of claim 17, wherein the formation of the block of conductive material comprises:
- forming a layer of insulation material along the sloped upper surface and the side surface that has a thickness that permits Fowler-Nordheim tunneling.

24. The method of claim 17, wherein the formation of the floating gate comprises:
- forming a layer of conductive material;
- performing a slope etch on the layer of conductive material to form the sloped upper surface;
- removing a portion of the conductive material layer adjacent the sloped upper surface to form the side surface that meets the sloped upper surface at the acute edge.

25. A method of forming an array of electrically programmable and erasable memory devices comprising:
- forming spaced apart isolation regions on the substrate which are substantially parallel to one another and extend in a first direction, with an active region between each pair of adjacent isolation regions, wherein the substrate has a first conductivity type; and
- forming pairs of memory cells in each of the active regions, wherein the formation of each of the memory cell pairs comprises:
  - forming a first region in the substrate,
  - forming a pair of second regions in the substrate, with a pair of channel regions each formed in the substrate between the first region and one of the second regions, wherein the first and second regions have a second conductivity type, and wherein each of the channel regions includes a first portion adjacent the first region and a second portion adjacent one of the second regions;
  - forming a pair of electrically conductive floating gates each having a first portion disposed over and insulated from the first region and a second portion disposed over and insulated from one of the channel region first portions for controlling a conductivity thereof, wherein each of the floating gate first portions includes a sloped upper surface and a side surface that meet at an acute edge;

forming a block of conductive material disposed over and in electrical contact with the first region, wherein the block of conductive material comprises a first portion that is laterally adjacent to and insulated from the floating gate first portions, and a second portion that extends up and over and is insulated from the floating gate first portions; and forming a pair of electrically conductive control gates each disposed over and insulated from one of the channel region second portions for controlling a conductivity thereof.

26. The method of claim 25, wherein each of the control gates comprises a first portion that is laterally adjacent to and insulated from one of the floating gate second portions, and a second portion that extends up and over and is insulated from one of the floating gate second portions.

27. The method of claim 25, wherein each of the floating gate second portions includes a generally planar horizontally extending upper surface portion disposed under one of the control gates.

28. The method of claim 25, wherein each of the acute edges directly faces and is insulated from the block of conductive material.

29. The method of claim 25, wherein the formation of each of the blocks of conductive material comprises:

forming spacers of conductive material each having a first portion that is laterally adjacent to and insulated from one of the floating gate first portions and a second portion that extends up and over and is insulated from one of the floating gate first portions; and forming conductive material that is disposed over and in electrical contact with the first region, and is disposed adjacent to and in electrical contact with the spacers.

30. The method of claim 29, wherein each of the acute edges directly faces and is insulated from one of the spacers of the conductive material.

31. The method of claim 25, wherein the formation of each of the blocks of conductive material comprises:

forming a layer of insulation material along the sloped upper surfaces and the side surfaces of the floating gates having a thickness that permits Fowler-Nordheim tunneling.

32. The method of claim 25, wherein the formation of each of the floating gates comprises:

forming a layer of conductive material;

performing a slope etch on the layer of conductive material to form the sloped upper surface;

removing a portion of the conductive material layer adjacent the sloped upper surface to form the side surface that meets the sloped upper surface at the acute edge.

33. The method of claim 25, further comprising:

forming a plurality of conductive control lines of conductive material each extending across the active and isolation regions in a second direction perpendicular to the first direction and each electrically connecting together one of the control gates from each of the active regions.

34. The method of claim 25, further comprising:

forming a plurality of conductive source lines of conductive material each extending across the active and isolation regions in a second direction perpendicular to the first direction and each electrically connecting together one of the conductive blocks from each of the active regions.

* * * * *